United States Patent
Rahmes et al.

(10) Patent No.: US 7,752,018 B2
(45) Date of Patent: Jul. 6, 2010

(54) GEOSPATIAL MODELING SYSTEM PROVIDING BUILDING ROOF TYPE IDENTIFICATION FEATURES AND RELATED METHODS

(75) Inventors: Mark Rahmes, Melbourne, FL (US);
Harlan Yates, Melbourne, FL (US);
Stephen Connetti, Melbourne, FL (US);
Anthony O'Neil Smith, Gainesville, FL (US)

(73) Assignee: Harris Corporation, Melbourne, FL (US)

( * ) Notice: Subject to any disclaimer, the term of this patent is extended or adjusted under 35 U.S.C. 154(b) by 996 days.

(21) Appl. No.: 11/458,839

(22) Filed: Jul. 20, 2006

(65) Prior Publication Data
US 2008/0021683 A1 Jan. 24, 2008

(51) Int. Cl.
*G06F 17/50* (2006.01)
*G06F 17/10* (2006.01)
(52) U.S. Cl. .............................................. 703/2; 703/1
(58) Field of Classification Search ............... 703/1, 703/2; 382/181
See application file for complete search history.

(56) References Cited

U.S. PATENT DOCUMENTS

| | | | |
|---|---|---|---|
| 6,654,690 B2 | 11/2003 | Rahmes et al. | 702/5 |
| 6,987,520 B2 | 1/2006 | Criminisi et al. | 345/629 |
| 2004/0153128 A1 | 8/2004 | Suresh et al. | 607/14 |
| 2006/0013442 A1 | 1/2006 | McDowall et al. | 382/109 |
| 2006/0013443 A1 | 1/2006 | McDowall et al. | 382/109 |

OTHER PUBLICATIONS

Christopher Jaynes, Edward Riseman, Allen Hanson, Recognition and reconstruction of buildings from multiple aerial images, Computer Vision and Image Understanding, vol. 90, Issue 1, Apr. 2003, pp. 68-98, ISSN 1077-3142, DOI: 10.1016/S1077-3142(03)00027-4. (http://www.sciencedirect.com/science/article/B6WCX-48GP43X-1/2/1c5e6059fcb37a9f614691210.*

Bruzzone et al., *Recognition and Detection of Impact Craters from EO Products*, Department of Information and Communication Technology—University of Trento, 2004, 8 pages.

Vozikis, *Automated Generation and Updating of Digital City Models Using High-Resolution Line Scanning Systems*, 2004, International Archives of Photogrammetry, Remote Sensing and Spatial Information Sciences, vol. 35, 6 pages.

Fisher et al., *Roberts Cross Edge Detector*, 1993, available at www.homepages.inf.ed.ac.uk/rbf/HIPR2/roberts.htm, 7 pages.

(Continued)

*Primary Examiner*—Paul L Rodriguez
*Assistant Examiner*—Luke Osborne
(74) *Attorney, Agent, or Firm*—Allen, Dyer, Doppelt, Milbrath & Gilchrist, P.A.

(57) ABSTRACT

A geospatial modeling system may include a geospatial model database and a processor. The processor may cooperate with the geospatial database for identifying a building roof type defined by building roof data points as being from among a plurality of possible building roof types. This may be done based upon applying multi-directional gradient calculations to the building roof data points.

21 Claims, 14 Drawing Sheets

OTHER PUBLICATIONS

Fisher et al , *Hough Transform*, 1993, available at www.homepages.inf.ed.ac.uk/rbf/HIPR2/hough.htm, 12 pages.

Verdera et al., *Inpainting Surface Holes*, May 2, 2003, 12 pages.

Bertalmio et al., *Navier-Stokes, Fluid Dynamics, and Image and Video Inpainting*, Proceedings of the International Conference on Computer Vision and Pattern Recognition IEEE, 2001, vol. 1, pp. 355-362.

Reigber et al., *Interference Suppression in Synthesized SAR Images*, IEEE Geoscience and Remote Sensing Letters, vol, 2, No. 1, pp. 45-49, Jan. 2005.

Limp, *Raster GIS Packages Finally Receive Well-Deserved Recognition*, Geoworld, 2000, 14 pages.

\* cited by examiner

GEOSPATIAL MODELING SYSTEM PROVIDING BUILDING ROOF TYPE IDENTIFICATION FEATURES AND RELATED METHODS

The present invention relates to the field of topography, and, more particularly, to a system and related methods for generating topographical models.

BACKGROUND OF THE INVENTION

Topographical models of geographical areas may be used for many applications. For example, topographical models may be used in flight simulators and for planning military missions. Furthermore, topographical models of man-made structures (e.g., cities) may be extremely helpful in applications such as cellular antenna placement, urban planning, disaster preparedness and analysis, and mapping, for example.

Various types and methods for making topographical models are presently being used. One common topographical model is the digital elevation map (DEM). A DEM is a sampled matrix representation of a geographical area which may be generated in an automated fashion by a computer. In a DEM, coordinate points are made to correspond with a height value. DEMs are typically used for modeling terrain where the transitions between different elevations (e.g., valleys, mountains, etc.) are generally smooth from one to a next. That is, DEMs typically model terrain as a plurality of curved surfaces and any discontinuities therebetween are thus "smoothed" over. Thus, in a typical DEM no distinct objects are present on the terrain.

One particularly advantageous 3D site modeling product is RealSite® from the present Assignee Harris Corp. RealSite® may be used to register overlapping images of a geographical area of interest, and extract high resolution DEMs using stereo and nadir view techniques. RealSite® provides a semi-automated process for making three-dimensional (3D) topographical models of geographical areas, including cities, that have accurate textures and structure boundaries. Moreover, RealSite® models are geospatially accurate. That is, the location of any given point within the model corresponds to an actual location in the geographical area with very high accuracy. The data used to generate RealSite® models may include aerial and satellite photography, electro-optical, infrared, and light detection and ranging (LIDAR).

Another advantageous approach for generating 3D site models is set forth in U.S. Pat. No. 6,654,690 to Rahmes et al., which is also assigned to the present Assignee and is hereby incorporated herein in its entirety by reference. This patent discloses an automated method for making a topographical model of an area including terrain and buildings thereon based upon randomly spaced data of elevation versus position. The method includes processing the randomly spaced data to generate gridded data of elevation versus position conforming to a predetermined position grid, processing the gridded data to distinguish building data from terrain data, and performing polygon extraction for the building data to make the topographical model of the area including terrain and buildings thereon.

One difficulty in generating automated topographical models is distinguishing between the various types of building structures that are present in a given set of geospatial data. That is, it is often desirable to substitute a rendering of a building and its roof using geometric shapes in place of collected geospatial data to provide crisp and realistic looking buildings. However, buildings may have different roof types, such as flat roofs, sloped (e.g., gabled or hipped) roofs, or domed roofs, for example. Moreover, some complex building shapes may have multiple roof types or combinations thereof. For example, some buildings may have multiple intersecting sloped roofs. Thus, it often becomes necessary for an operator to intervene and manually identify a building or roof type from building data points before an automated computer process can be used to substitute the appropriate building shapes therefor. Yet, such manual intervention is time consuming and, as a result, expensive and potentially cost prohibitive for many applications, particularly where topographical models of urban areas with numerous buildings are to be generated.

SUMMARY OF THE INVENTION

In view of the foregoing background, it is therefore an object of the present invention to provide a geospatial modeling system for providing building roof type identification features and related methods.

This and other objects, features, and advantages are provided by a geospatial modeling system which may include a geospatial model database and a processor. More particularly, the processor may cooperate with the geospatial database for identifying a building roof type defined by building roof data points as being from among a plurality of possible building roof types. This may be done based upon applying multi-directional gradient calculations to the building roof data points.

In addition, the processor may identify the building roof type as being from among a flat roof type, a sloped roof type, a complex sloped roof type, and a domed roof type. The multi-direction gradient calculations may include Robert's cross calculations. More specifically, the Robert's cross calculations may include eight-way Robert's cross calculations, for example. The processor may further remove ground and vegetation data points from geospatial model data to select the building roof data points.

The multi-direction gradient calculations may include using a grid centered for each building roof data point, summing distances of opposite sides in the grid, and identifying building roof data points whose sum is within a threshold from zero as being localized peak data points. More particularly, the multi-direction gradient calculations may further include determining a standard deviation for localized peak data points over a selected building roof area, and if the selected building roof area is greater than a threshold portion of a total building roof area, and if the standard deviation is below a threshold standard deviation, then indicating the building roof type as a flat roof type.

The multi-direction gradient calculations may also include removing groups of contiguous localized peak data points being less than a threshold in number. Further, the multi-direction gradient calculations may include determining if a length of contiguous localized peak data points remains, and, if so, then identifying the building roof type as a sloped roof type. In addition, a plurality of intersecting lengths of contiguous localized peak data points may be determined, and, if so, the building roof type may be identified as a complex sloped roof type.

Furthermore, the processor may determine whether the building roof data points define a circular shape, and the multi-direction gradient calculations may include calculating at least one elevation histogram for the roof building data points. Moreover, the multi-direction gradient calculations may include calculating elevation histogram data for the roof building data points, and, if a standard deviation of the elevation histogram data is below a threshold, then identifying the building roof type as a domed roof type.

Additionally, the geospatial model database may store at least one respective building roof shape for each of the plurality of possible building roof types. As such, the processor may cooperate with the geospatial model database to substitute in place of the building roof data points the at least one respective building roof shape for the identified building roof type.

A geospatial modeling method aspect may include storing building roof data points in a geospatial model database. The method may further include identifying a building roof type defined by building roof data points as being from among a plurality of possible building roof types using a processor based upon applying multi-directional gradient calculations to the building roof data points.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and completer and will fully convey the scope of the invention to those skilled in the art. Like numbers refer to like elements throughout.

Figure 1:
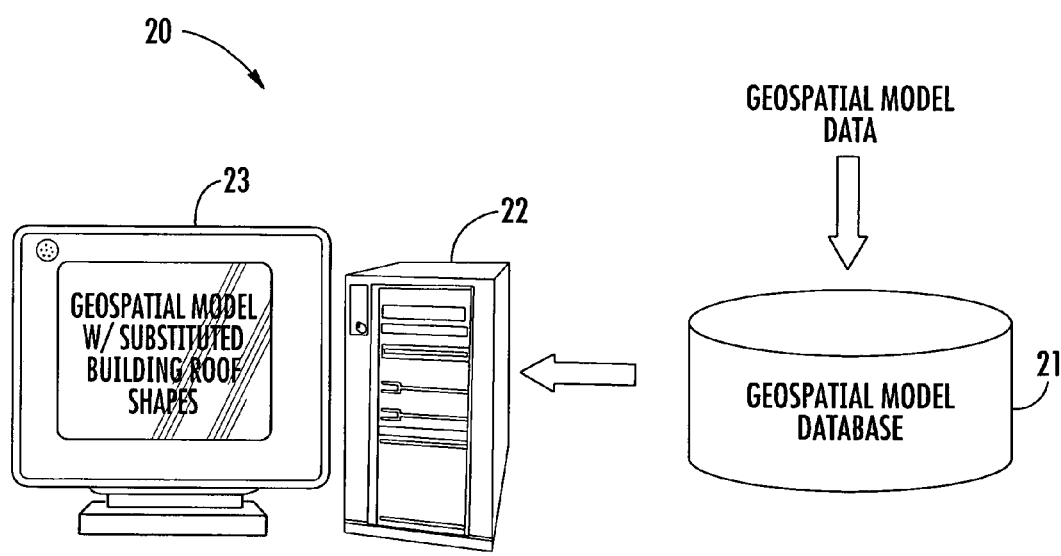
FIG. 1 is a schematic block diagram of a geospatial modeling system in accordance with the invention.
Figure 2A:
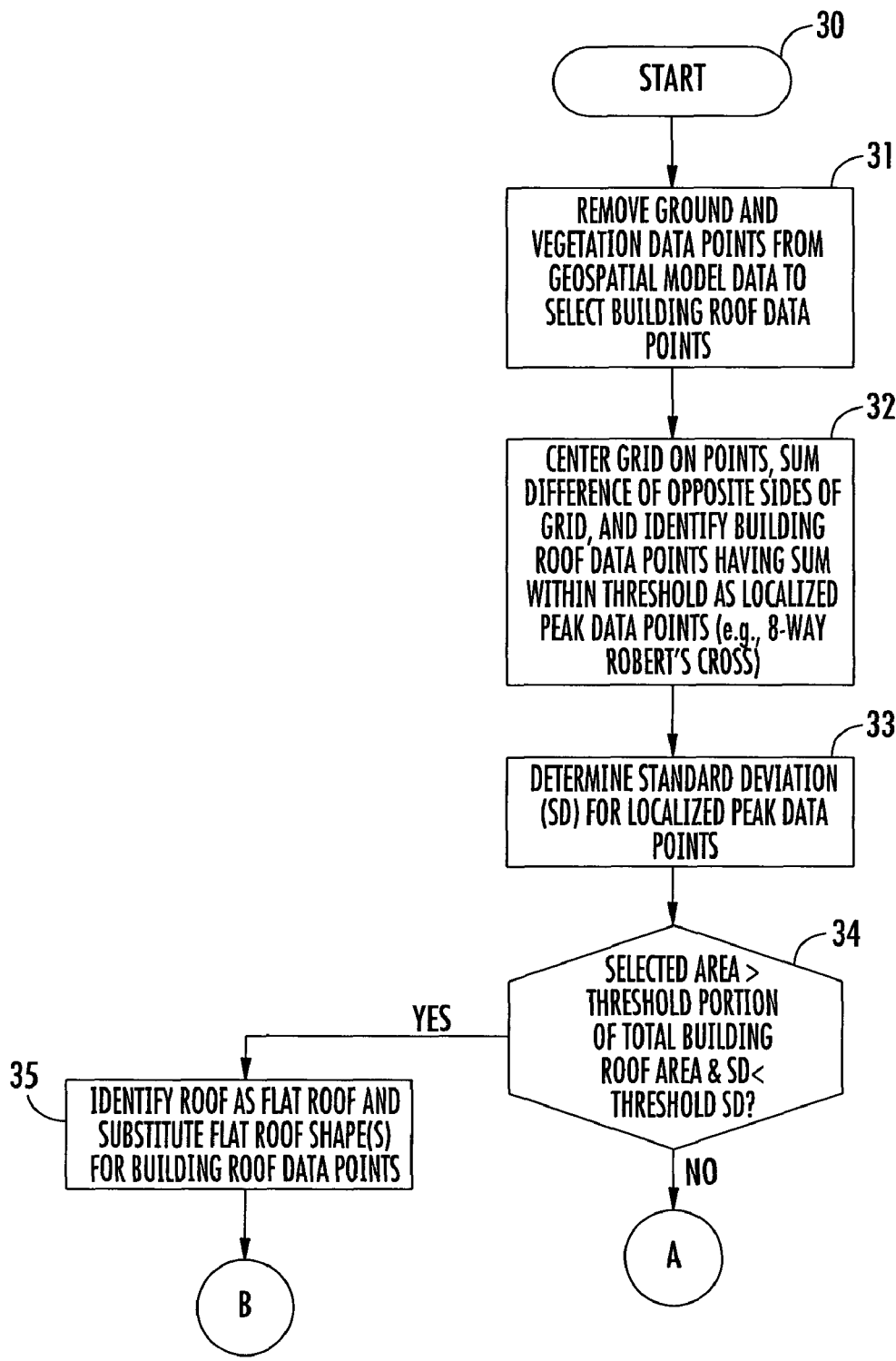
FIG. 2 is a flow diagram illustrating a geospatial modeling method in accordance with the invention.
Figure 2B:
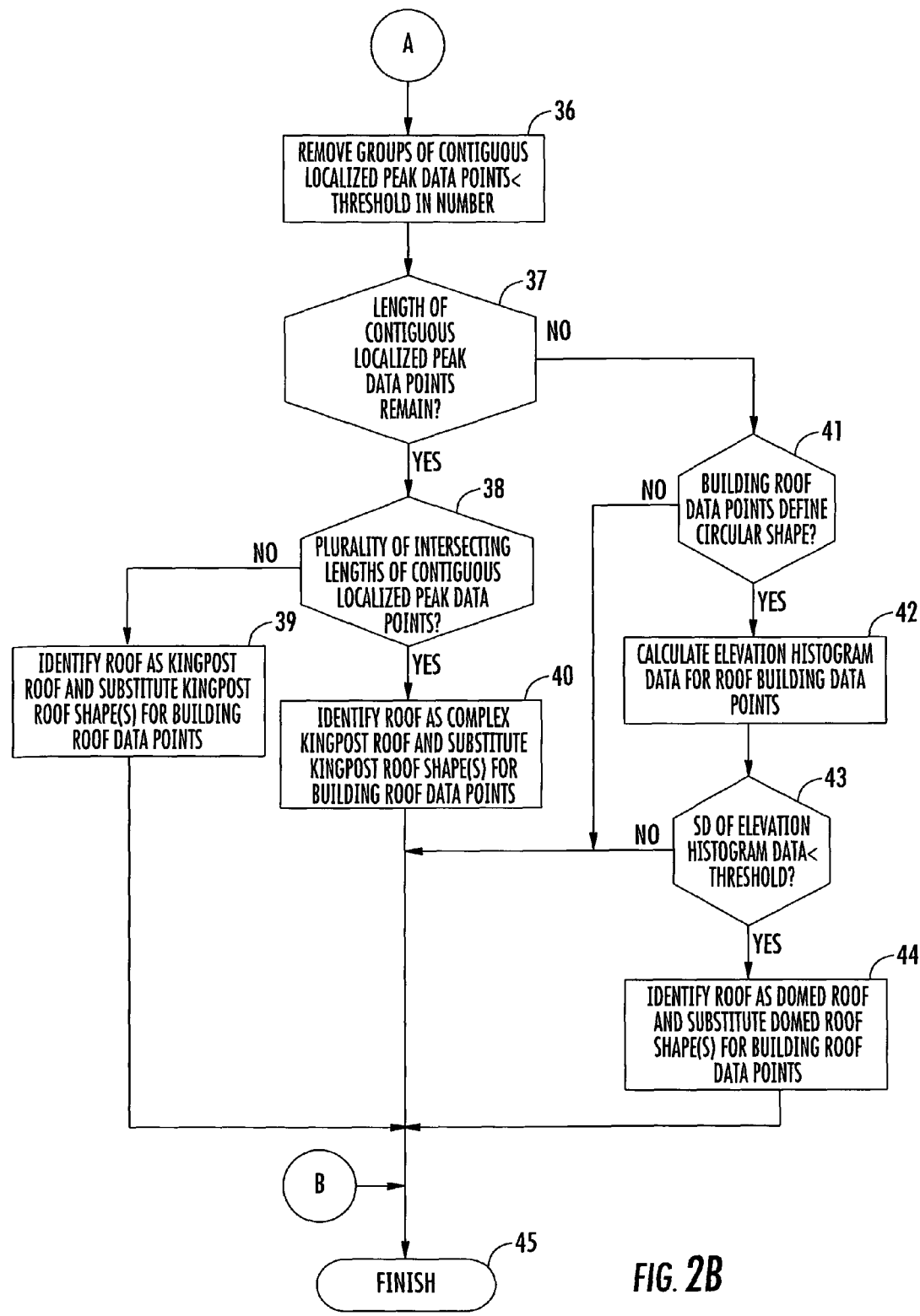

Referring initially to FIG. 1, a geospatial modeling system 20 illustratively includes a geospatial model database 21 and a processor 22 that may advantageously be used for identifying and rendering different types of building roofs. By way of example, the processor 22 may be a central processing unit (CPU) of a PC, Mac, or other computing workstation, for example. A display 23 may also be coupled to the processor 22 for displaying geospatial modeling data, as will be discussed further below. The processor 22 may be implemented using a combination of hardware and software components to perform the various operations that will be discussed further below, as will be appreciated by those skilled in the art.

By way of example, the geospatial data may be captured using various techniques such as stereo optical imagery, Light Detecting and Ranging (LIDAR), Interferometric Synthetic Aperture Radar (IFSAR), etc. Generally speaking, the data will be captured from overhead (e.g., nadir) views of the geographical area of interest by airplanes, satellites, etc., as will be appreciated by those skilled in the art. However, oblique images of a geographical area of interest may also be used in addition to (or instead of) the nadir images to add additional 3D detail to a geospatial model. The raw image data captured using LIDAR, etc., may be processed upstream from the geospatial model database 21 into a desired format, such as a digital elevation model (DEM), or this may be done by the processor 22.

Turning now to FIGS. 2 through 9, beginning at Block 30, the processor 22 may remove ground and vegetation data points from geospatial model data to select building roof data points for processing, at Block 31. By way of example, this may be done using the process set forth in the above-noted U.S. Pat. No. 6,654,690 to Rahmes et al., as well as with RealSite® or other suitable approaches. Once the building roof data points are isolated, the processor 22 may begin identifying the building roof type defined by the building roof data points as being from among a plurality of possible building roof types. By way of example, the building roof types may include flat roofs, sloped roofs, complex slopeds roofs, and domed roofs (or combinations thereof). Generally speaking, this identification is done based upon applying multi-directional gradient calculations to the building roof data points.

Figure 3:
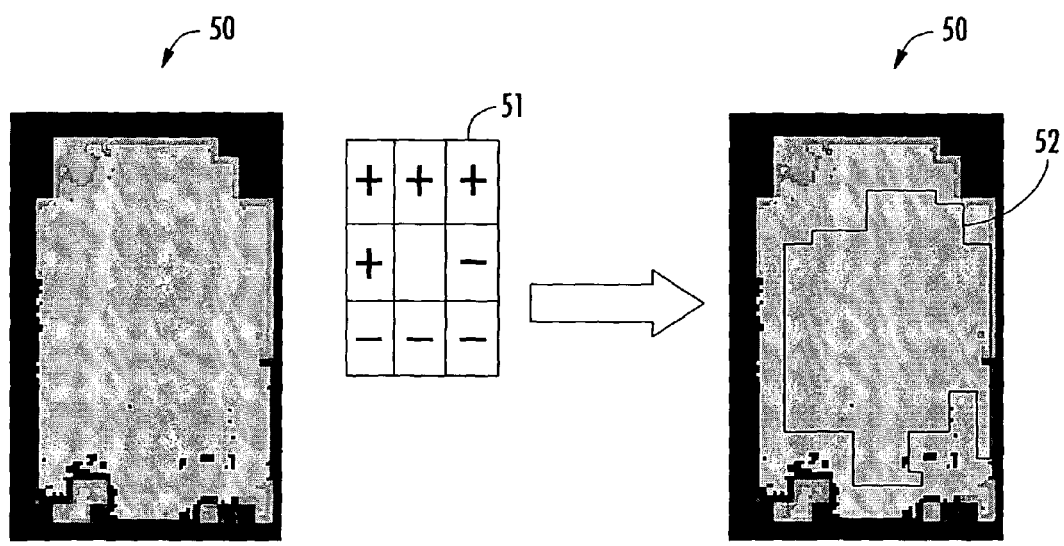
FIG. 3 is a series of top views of flat building roof data points illustrating the flat building roof identification method steps of FIG. 2.

More particularly, in the example shown in FIG. 3, building roof data points 50 are from a building with a flat roof. The multi-direction gradient calculations may include Robert's cross calculations and, more specifically, calculations based upon an eight-way (i.e., 3×3) Robert's cross grid 51, for example. This is done by centering the Robert's cross grid 51 for each building data point 50, summing distances of points on opposite sides in the grid, and identifying building roof data points whose sum is within a threshold from zero as being localized peak data points, at Block 32. That is, any building roof data point 50 having a sum of the differences of the points on opposite sides of the grid that is substantially zero will have a substantially zero slope, as will be appreciated by those skilled in the art. This indicates that the given point is not on an inclined surface, i.e., it is either located at a localized peak or on a flat surface (both of which are referred to as localized peak points herein).

To determine whether the identified points are part of a flat roof, the processor 22 determines a standard deviation for the localized peak data points over a selected building roof area 52, at Block 33. The building roof area 52 may be selected based upon an aggregation of localized peak data points. Selection is automatic based on a low (near zero slope) value provided by Robert's Cross Operator. If the selected building roof area 52 is greater than a threshold portion of a total building roof area, and if the standard deviation is below a threshold standard deviation, then the processor 22 identifies the building roof type as a flat roof type, at Blocks 34-35. By way of example, the threshold portion of the total building roof area may be greater than about 65%), and the threshold standard deviation may be less than about one meter. Of course, different thresholds may be used in different embodiments. The processor 22 may accordingly substitute one or more geometric objects/shapes in place of the building data points that approximates the flat roof building, such as the building 100 in FIG. 10, and optionally display the shape on the display 23 with or without accompanying terrain data (i.e., ground, foliage, etch).

Figure 4:
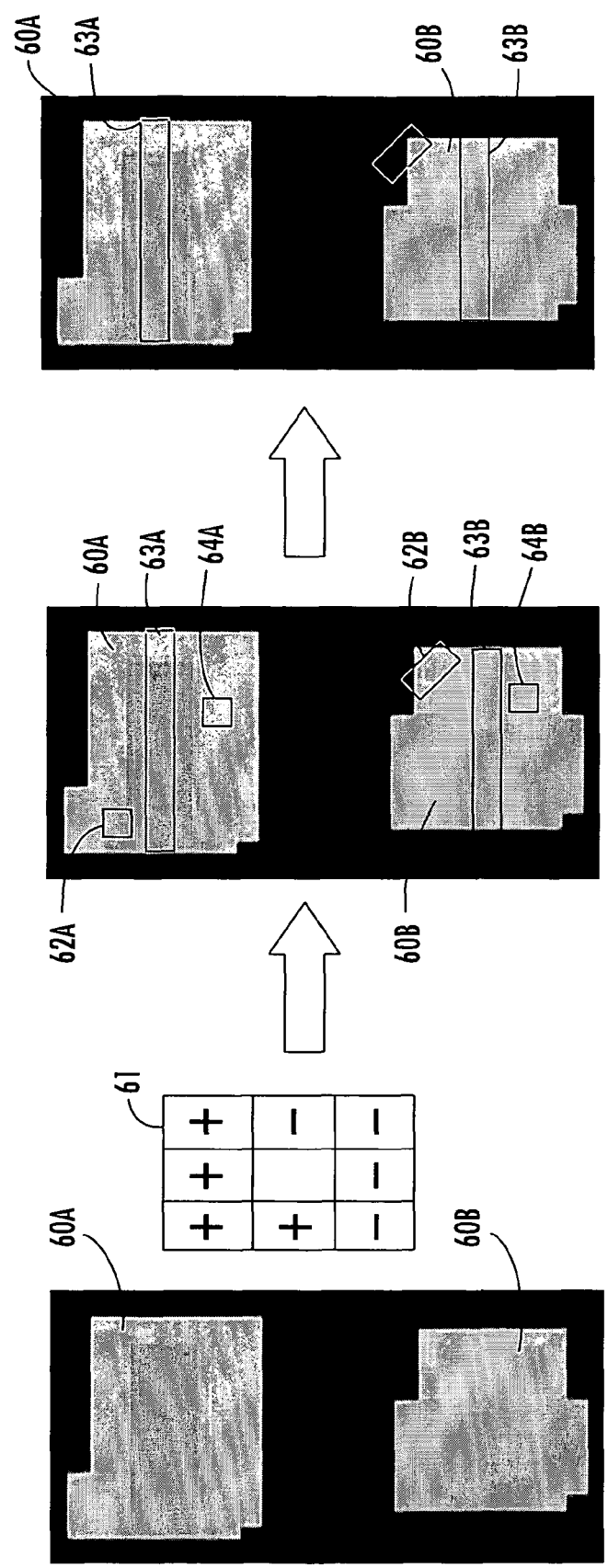
FIG. 4 is a series of top views of sloped building roof data points illustrating the sloped building roof identification method steps of FIG. 2.

If either of the above conditions is not met, however, then the processor 22 will proceed to determine whether the building has one or more sloped roof portions. Referring more particularly to FIG. 4, the processor 22 removes groups of contiguous localized peak data points being less than a threshold in number, at Block 36. For example, a group of less than three contiguous points may be excluded from consideration in determining whether the building roof data points correspond to a sloped roof. In the illustrated example, two sets of building roof data points 60a, 60b for buildings each having a standard sloped roof are shown. After performing calculations based upon the 3×3 Robert's cross grid 61 as described above, three groups 62a, 63a, 64a and 62b, 63b, 64b of localized peak data points remain for the buildings 60a, 60b, respectively.

If a given length of a contiguous localized peak data point group remains, at Block 37, and this length has an area that is significantly less than the entire area of the entire roof but is significantly greater than the lengths of any other remaining groups, then the processor 22 identifies the roof as being of a single sloped roof type (Block 39) if no more than one such group is present, at Block 38. In the illustrated example, the groups 63a and 63b meet this criteria and therefore represent the apex of the sloped roof structure. However, if there are more than four corners, this identifies the roof as a complex sloped roof (Block 40). That is, a complex sloped roof has multiple sloped roof features with multiple apexes.

Figure 5:
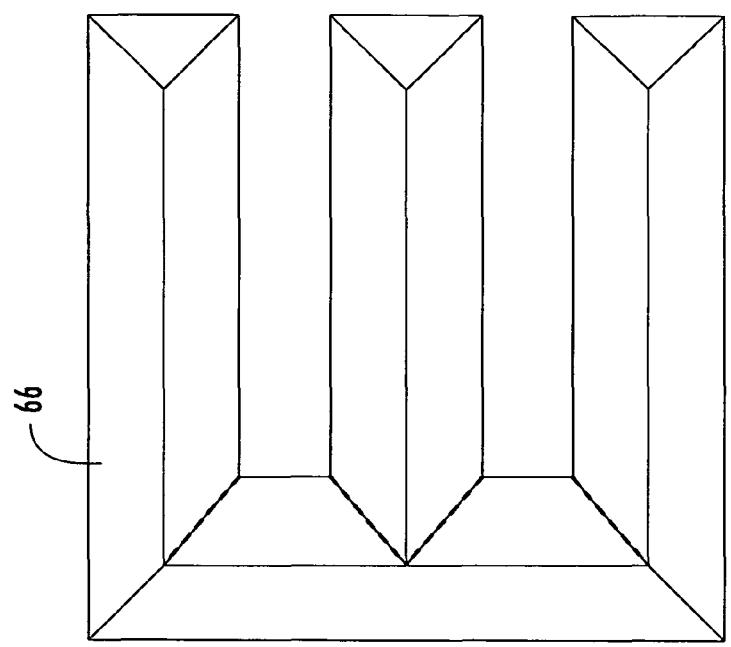
FIGS. 5-8 are schematic block diagrams illustrating complex sloped roof rendering in accordance with the invention.
Figure 5:
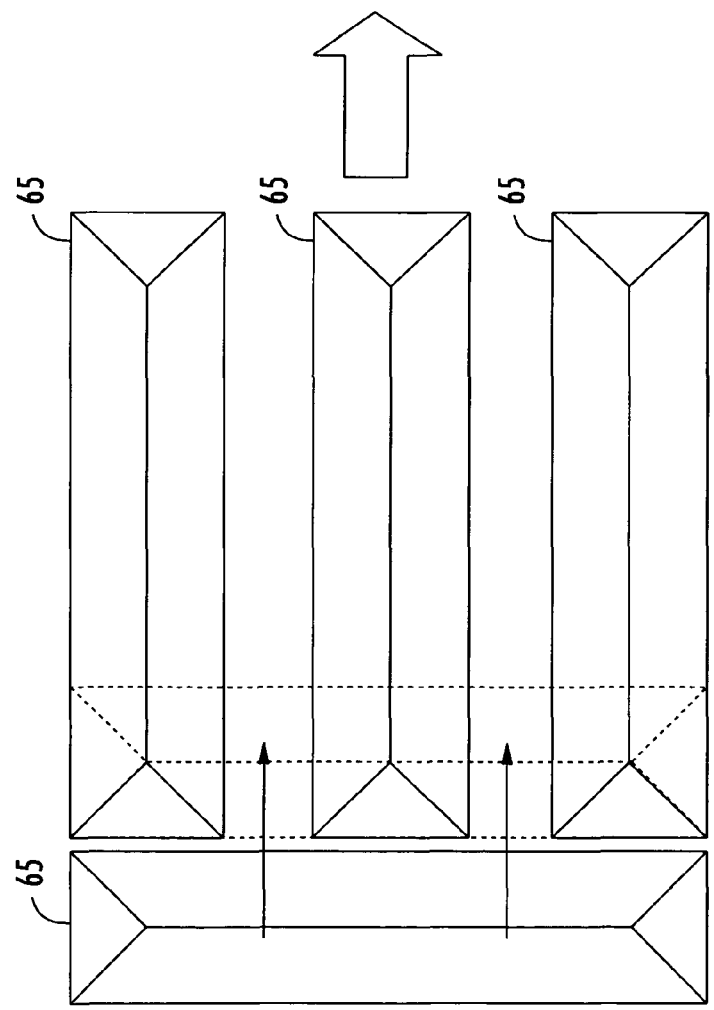
Figure 10:
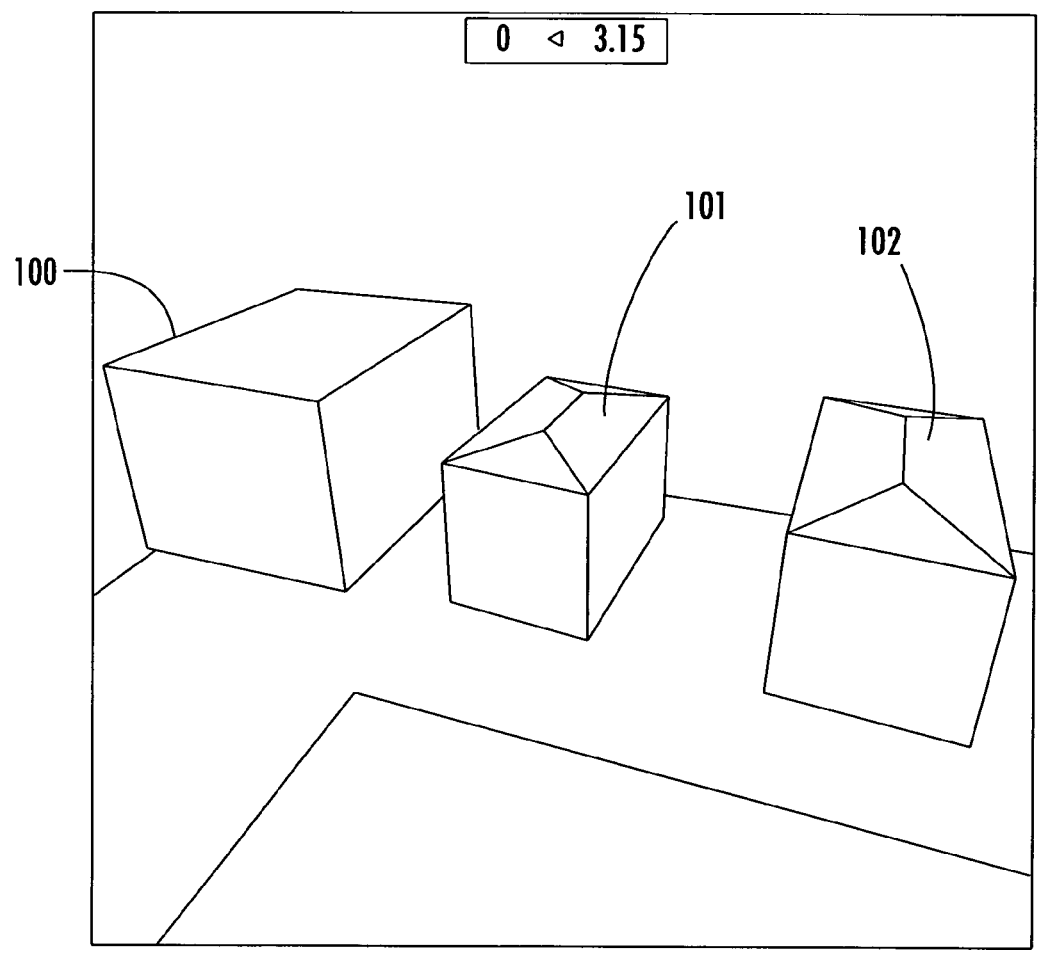
FIG. 10 is a perspective view of buildings with flat and sloped roofs rendered in accordance with the present invention.

To construct a sloped or complex sloped roof, the processor 22 generates sloped roof/building shapes 65 (FIG. 5). For a single sloped roof, the processor 22 fits the sloped roof shape 65 to the width, length, and height of the building corresponding to the building data points. Exemplary single sloped roof buildings 101, 102 rendered using the sloped roof shape 65 are shown in FIG. 10. For rendering a complex sloped roof which includes more than one sloped roof shape 65, the complex sloped roof can be segmented into a plurality of intersecting sloped roof shapes, as shown in FIG. 5, which are merged to provide a single complex sloped roof/building structure 66.

Figure 6:
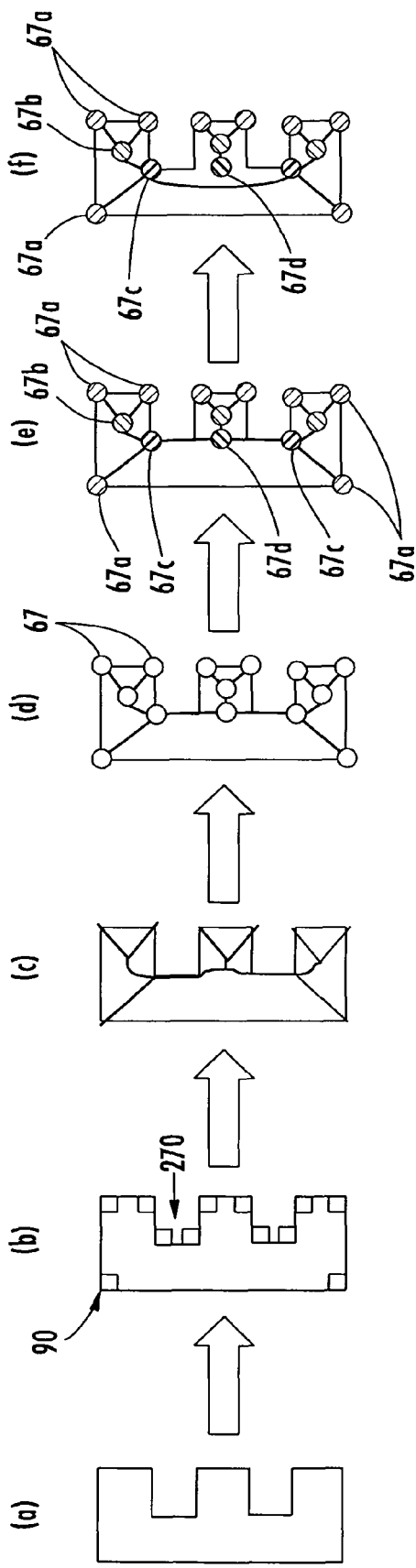
Figure 7:
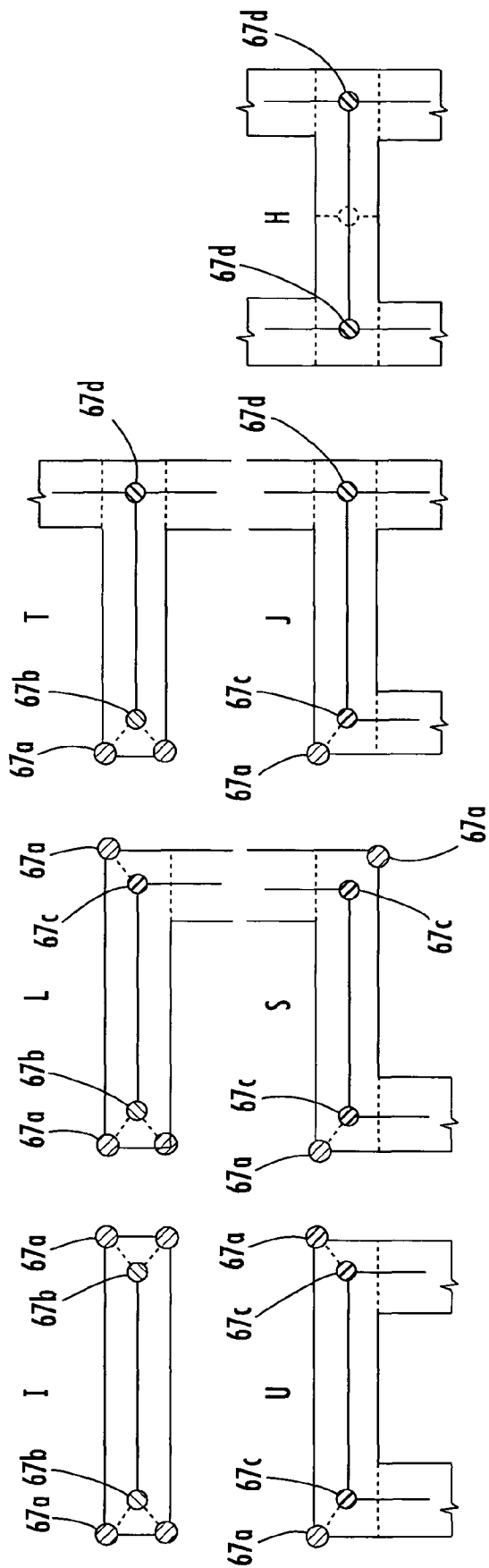
Figure 8:
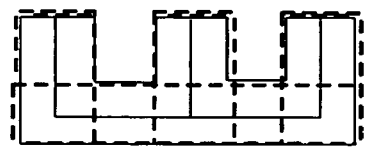
Figure 8:
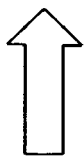
Figure 8:
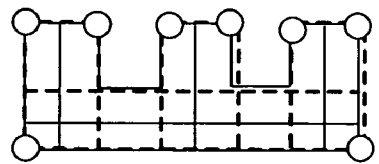
Figure 8:
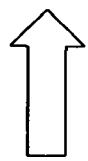
Figure 8:
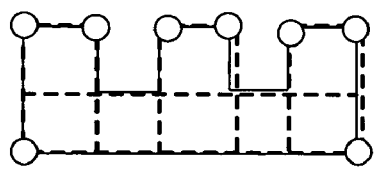
Figure 8:
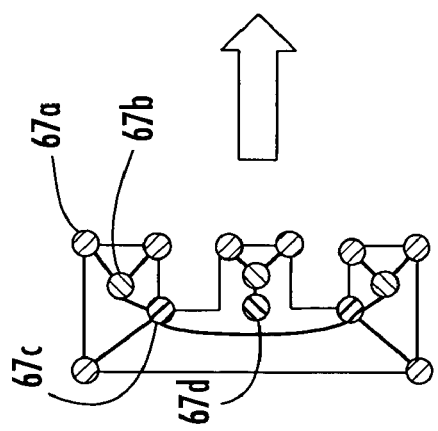
Figure 9:
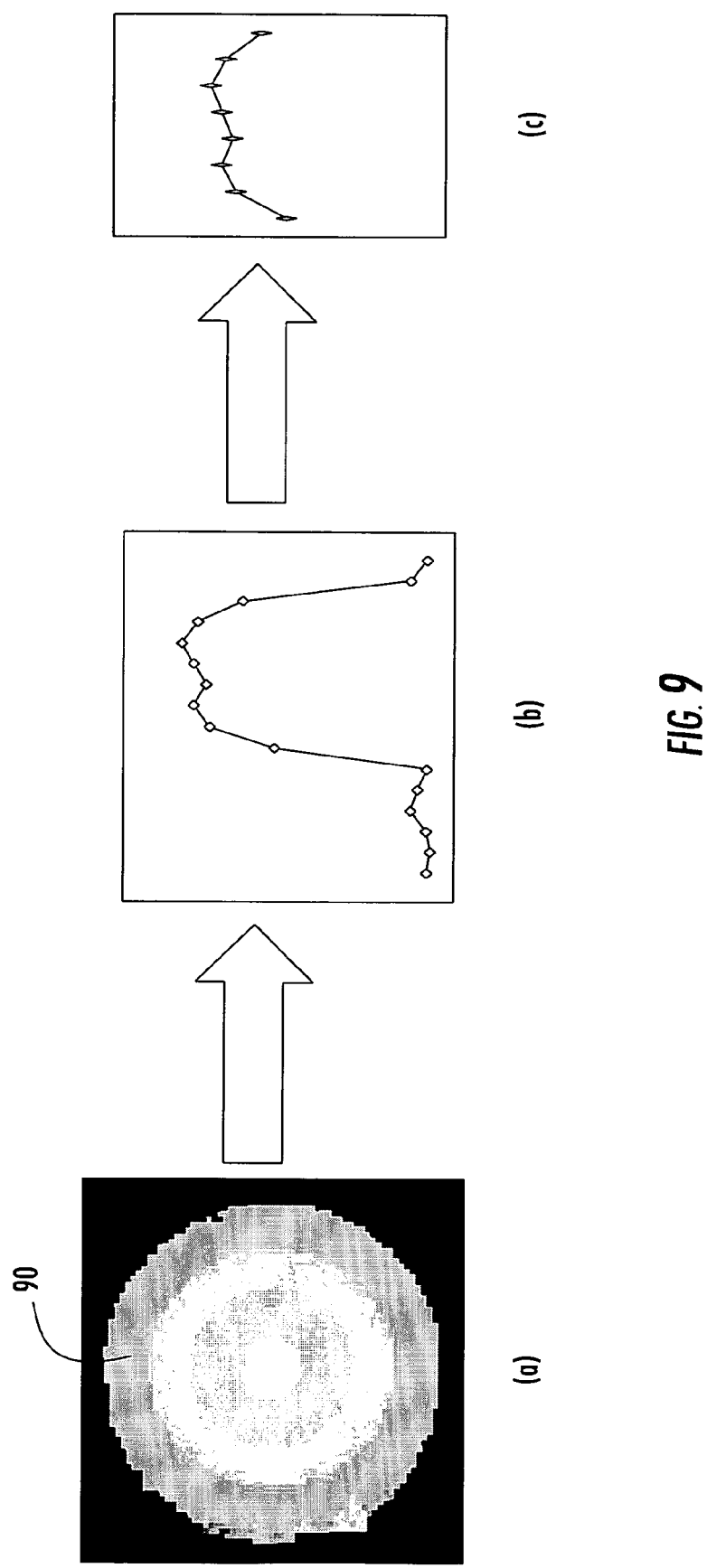
FIG. 9 is top view of domed roof building data points and corresponding histogram representations therefor illustrating the doomed roof identification method steps of FIG. 2.

More particularly, the process of rendering different sloped roof shapes is further illustrated in FIGS. 6 through 8. The processor 22 first verifies that the polygon that approximates the building shape is segmentable. That is, the processor 22 checks to make sure that all of the angles of the building are 90° or 270° (i.e., negative 90 degrees) angles (FIG. 6(b)). Then, the shape is graphically skeletonized (FIG. 6(c)) and reduced to nodes 67 and edges by removing points with exactly two neighbors, and then merging any adjacent points (FIG. 6(d)).

The edge points 67 are then classified based upon the number of their respective neighbors. That is, an edge point having one neighboring edge point is classified as an end point 67a. An edge point with three neighboring edge points, two of which are end points 67a, is classified as a sloped end point 67b. Moreover, an edge point with three neighboring edge points, one of which is an end point 67a, is classified as a corner point 67c. Further, an edge point with three neighboring edge points and no adjacent end points 67a is classified as a T-junction point 67d. Additionally, an edge point having four neighboring edge points is classified as a cross-junction point (i.e., it is located at the center of a "+" shaped complex sloped building roof structure), which is not shown in the example illustrated in FIG. 6.

Figure 11:
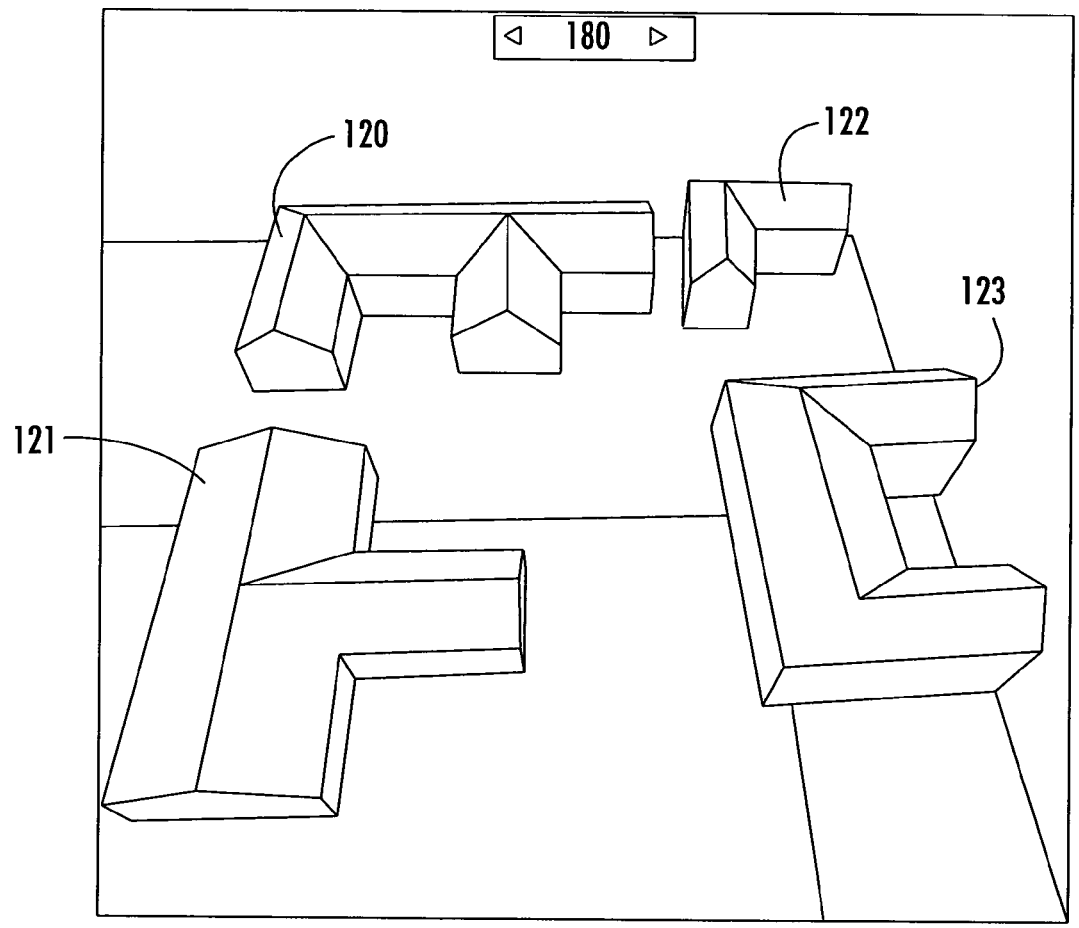
FIGS. 11 and 12 are perspective views of buildings with complex sloped roofs rendered in accordance with the present invention.
Figure 12:
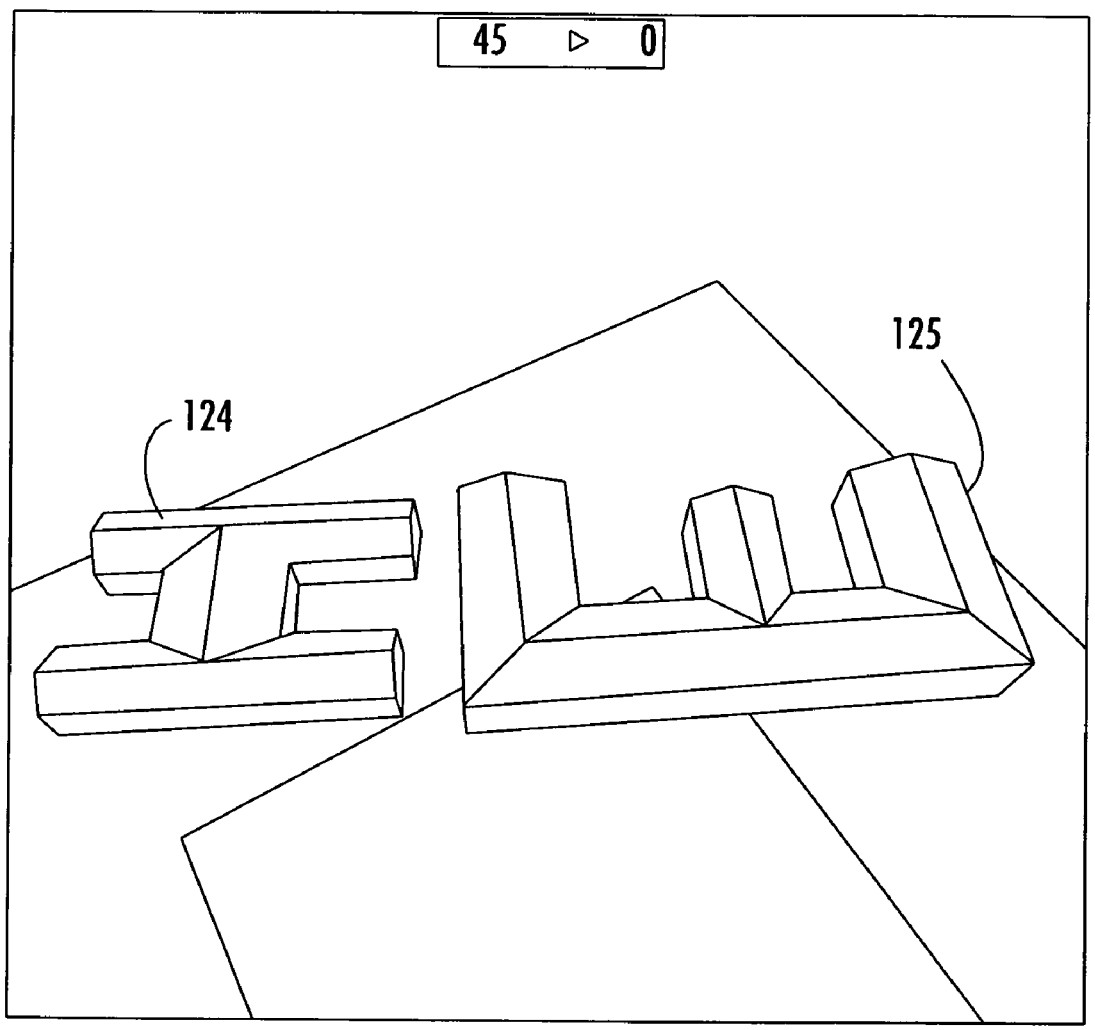

For each edge without an end point, a rectangle is generated as shown in FIG. 7 based upon the given geometric building shape (e.g., "I" shaped, "L" shaped, "T" shaped, "U" shaped, "S" shaped, "J" shaped, or "H" shaped). For each rectangle, the slopeds are then projected. For each sloped point not between two endpoints, this point is replaced with the nearest intersection between its sloped segment and any other sloped segment, as illustrated in FIG. 8, to render the final complex sloped roof shape. Exemplary complex sloped roof buildings 121 through 125 rendered using the above-described approach are shown in FIGS. 11 and 12.

Figure 13:
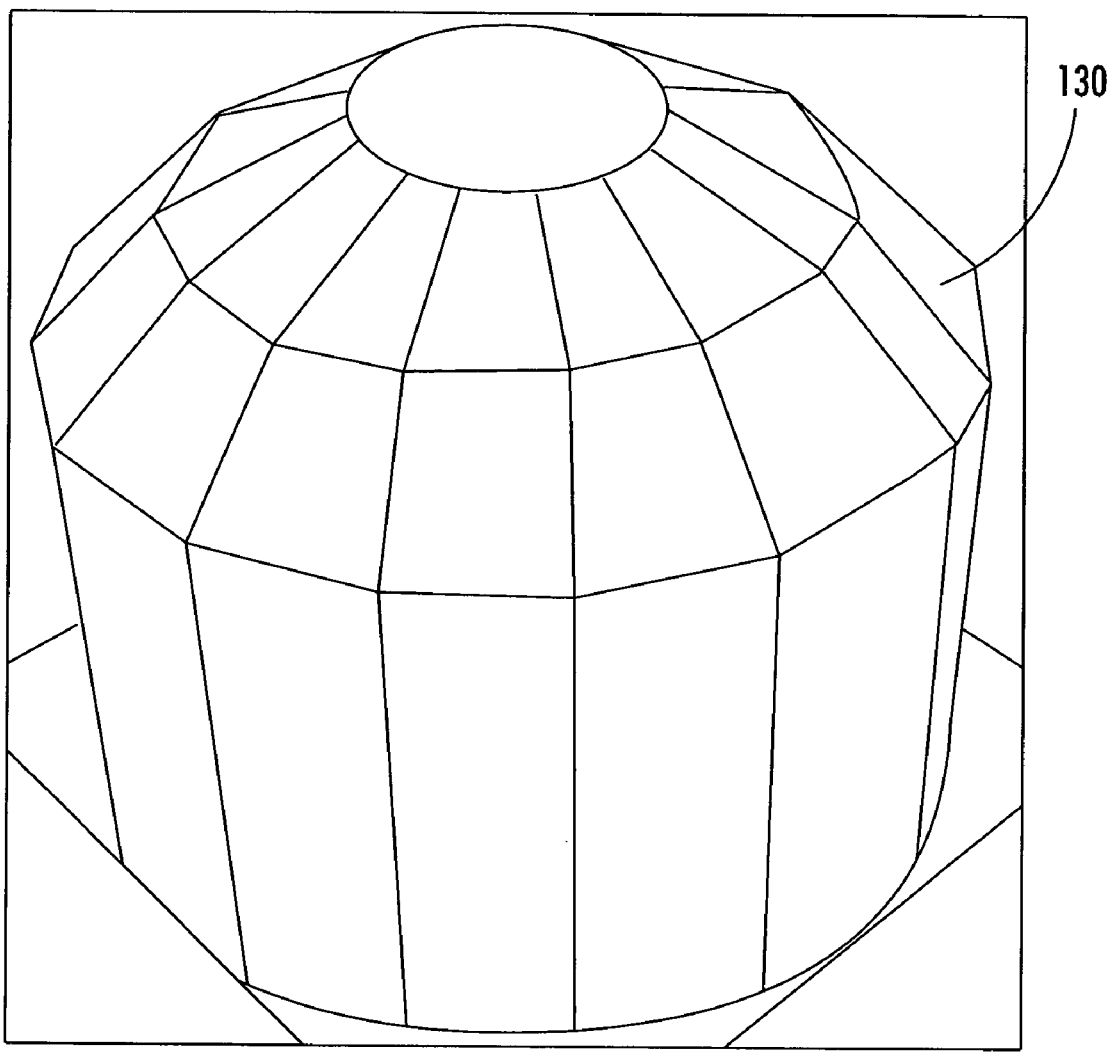
FIG. 13 is a perspective view of a domed roof building rendered in accordance with the present invention.

If it is determined that the roof type is neither flat nor a single/complex sloped roof, the processor 22 then determines whether the building roof data points define a circular shape, at Block 41, as will be appreciated by those skilled in the art. Referring to FIG. 9(a), a set of circular building roof data points 90 is shown. As used herein, "circular" is meant to include not only perfect circles but also variations thereof, including ovals, ellipses, semicircular shapes, etc. If the building roof data points 90 do define a circular shape, then the processor 22 generates an elevation histogram for the heights of the points, at Block 42 (FIG. 9(b)). Any statistical outlying points are then removed (FIG. 9(c)), and if the standard deviation of the remaining histogram points is below a threshold (e.g., it is low relative to its mean), then the roof is identified as a domed roof, and the processor 22 substitutes an appropriate dome shape therefor. An exemplary domed roof building 130 rendered using this approach is shown in FIG. 13.

Once the appropriate building roof type is identified and rendered (or if the roof type does not fall into one of the above-described categories), the illustrated method is concluded (Block 45). Of course, in an actual implementation the process may then be repeated to identify other building roof types for different sets of building rood data points.

It should be noted that while the above-described exemplary approach discusses an order of determining roof shapes beginning with flat roof shapes, then sloped roof shapes, and lastly doomed roof shapes, this order may be changed in different embodiments. Generally speaking, however, if a large urban area is being classified then it is desirable to start with the most common building roof type, as this may conserve processing resources. For example, in a downtown area, many of the buildings may have flat roofs, so it may be advantageous to first check if a given set of building roof data points corresponds to a flat roof. In a suburban area, many of the buildings may be houses, which are more likely to have sloped roof structures, and therefore in such applications it may be desirable to start with sloped roof identification.

Moreover, the processor 22 need not check for every possible roof type in every embodiment. For example, it may be desirable to identify only buildings that have a desired type of roof in some examples, for example. Also, the actual shapes of the buildings need not necessarily be rendered for display. That is, the above-described approach may be used to automatically identify building roof types with or without subsequent automatic roof/building rendering.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A geospatial modeling system comprising:
a geospatial model database; and
a processor cooperating with said geospatial model database for identifying a building roof type defined by building roof data points as being from among a plurality of possible building roof types based upon applying multi-directional gradient Robert's cross calculations to the building roof data points using a grid centered for each building data point, summing distances of opposite sides in the grid, and identifying building roof data points whose sum is within a threshold from zero as being localized peak data points, the multi-directional gradient Robert's cross calculations comprising eight-way Robert's cross calculations.

2. The geospatial modeling system of claim 1 wherein said processor identifies the building roof type as being from among a flat roof type, a sloped roof type, a complex sloped roof type, and a domed roof type.

3. The geospatial modeling system of claim 1 wherein said processor further removes ground and vegetation data points from geospatial model data to select the building roof data points.

4. The geospatial modeling system of claim 1 wherein the multi-direction gradient Robert's cross calculations further comprise determining a standard deviation for localized peak data points over a selected building roof area, and if the selected building roof area is greater than a threshold portion of a total building roof area, and if the standard deviation is below a threshold standard deviation, then identifying the building roof type as a flat roof type.

5. The geospatial modeling system of claim 1 wherein the multi-direction gradient Robert's cross calculations further comprise removing groups of contiguous localized peak data points being less than a threshold in number.

6. The geospatial modeling system of claim 5 wherein the multi-direction gradient Robert's cross calculations further comprise determining if a length of contiguous localized peak data points remains, and, if so, then identifying the building roof type as a sloped roof type.

7. The geospatial modeling system of claim 6 wherein the multi-direction gradient Robert's cross gradient calculations further comprise determining a plurality of intersecting lengths of contiguous localized peak data points, and, if so, identifying the building roof type as a complex sloped roof type.

8. The geospatial modeling system of claim 1 wherein said processor further determines whether the building roof data points define a circular shape, and calculates at least one elevation histogram for the roof building data points based thereon.

9. The geospatial modeling system of claim 8 wherein said processor further determines if a standard deviation of the elevation histogram data is below a threshold and, if so, indicates the building roof type as a domed roof type.

10. The geospatial modeling system of claim 1 wherein said geospatial model database stores at least one respective building roof shape for each of the plurality of possible building roof types; and wherein said processor cooperates with said geospatial model database to substitute in place of the building roof data points the at least one respective building roof shape for the identified building roof type.

11. A geospatial modeling system comprising:
a geospatial model database for storing at least one respective building roof shape for each of a plurality of possible building roof types; and
a processor cooperating with said geospatial model database for
identifying a building roof type defined by building roof data points as being from among the plurality of possible building roof types based upon applying multi-directional gradient Robert's cross calculations to the building roof data points using a grid centered for each building data point, summing distances of opposite sides in the grid, and identifying building roof data points whose sum is within a threshold from zero as being localized peak data points, the multi-directional gradient Robert's cross calculations comprising eight-way Robert's cross calculations, and
substituting in place of the building roof data points the at least one respective building roof shape for the identified building roof type.

12. The geospatial modeling system of claim 11 wherein said processor identifies the building roof type as being from among a flat roof type, a sloped roof type, a complex sloped roof type, and a domed roof type.

13. The geospatial modeling system of claim 11 wherein said processor further removes ground and vegetation data points from geospatial model data to select the building roof data points.

14. A geospatial modeling method comprising:
storing building roof data points in a geospatial model database; and
identifying a building roof type defined by building roof data points as being from among a plurality of possible building roof types using a processor based upon applying multi-directional gradient Robert's cross calculations to the building roof data points using a grid centered for each building data point, summing distances of opposite sides in the grid, and identifying building roof data points whose sum is within a threshold from zero as being localized peak data points, the multi-directional gradient Robert's cross calculations comprising eight-way Robert's cross calculations.

15. The method of claim 14 wherein identifying comprises identifying the building roof type as being from among a flat roof type, a sloped roof type, a complex sloped roof type, and a domed roof type.

16. The method of claim 15 wherein the multi-direction gradient Robert's cross calculations further comprise determining a standard deviation for localized peak data points over a selected building roof area, and if the selected building roof area is greater than a threshold portion of a total building roof area, and if the standard deviation is below a threshold standard deviation, then indicating the building roof type as a flat roof type.

17. The method of claim 15 wherein the multi-direction gradient Robert's cross calculations further comprise removing groups of contiguous localized peak data points being less than a threshold in number.

18. The method of claim 17 wherein the multi-direction gradient Robert's cross calculations further comprise determining if a length of contiguous localized peak data points remains, and, if so, then identifying the building roof type as a sloped roof type.

19. The method of claim 18 wherein the multi-direction gradient Robert's cross calculations further comprise determining a plurality of intersecting lengths of contiguous localized peak data points, and, if so, identifying the building roof type as a complex sloped roof type.

20. The method of claim 14 further comprising:
determining whether the building roof data points define a circular shape using the processor; and calculating elevation histogram data for the roof building data points, and, if a standard deviation of the elevation histogram data is below a threshold, then identifying the building roof type as a domed roof type.

21. The method of claim 14 wherein the geospatial model database stores at least one respective building roof shape for each of the plurality of possible building roof types; and further comprising using the processor to substitute in place of the building roof data points the at least one respective building roof shape for the identified building roof type.

* * * * *